United States Patent [19]

Dougherty et al.

[11] Patent Number: 5,391,460
[45] Date of Patent: Feb. 21, 1995

[54] RESIN COMPOSITION AND PROCESS FOR INVESTMENT CASTING USING STEREOLITHOGRAPHY

[75] Inventors: Thomas K. Dougherty, Playa Del Rey; William E. Elias, El Segundo; Timothy C. Thelander, Riverside; Mahesh N. Bhavnani, Diamond Bar, all of Calif.

[73] Assignee: Hughes Aircraft Company, Los Angeles, Calif.

[21] Appl. No.: 89,544

[22] Filed: Jul. 12, 1993

[51] Int. Cl.⁶ .............................. G03C 5/00
[52] U.S. Cl. .................... 430/269; 522/79; 164/526; 164/527
[58] Field of Search ............ 522/79; 164/526, 527; 430/269

[56] References Cited

U.S. PATENT DOCUMENTS

| | | | |
|---|---|---|---|
| 4,575,330 | 3/1986 | Hull | 425/174.4 |
| 4,844,144 | 7/1989 | Murphy et al. | 164/35 |
| 5,027,890 | 7/1991 | Lemon | 164/526 |
| 5,275,648 | 1/1994 | Cobett | 164/527 |

OTHER PUBLICATIONS

Payne, "Organic Coating Technology", vol. 1, John Wiley & Sons, Inc., New York, 1954, pp. 256, 257.

*Primary Examiner*—Marion E. McCamish
*Assistant Examiner*—Mark A. Chapman
*Attorney, Agent, or Firm*—M. E. Lachman; M. W. Sales; W. K. Denson-Low

[57] ABSTRACT

A resin composition for investment casting contains a moderate boiling temperature liquid inert diluent, having a boiling point in the range of about 200° to 300° C. The presence of the liquid inert diluent allows the resin to be used as a pattern, or model, in investment casting by preventing breaking of the mold during burnout of the resin. Any of the conventional resins suitable for stereolithography may be employed in the practice of the invention. To the resin is added a moderate boiling point solvent in the amount of about 5 to 30 wt %. Use of the moderate boiling point solvent in conjunction with the resin allows the pattern to shrink and crack at moderate temperature before final burnout. The shrinkage occurs faster and at a lower temperature as compared to the prior art.

18 Claims, No Drawings

RESIN COMPOSITION AND PROCESS FOR INVESTMENT CASTING USING STEREOLITHOGRAPHY

BACKGROUND OF THE INVENTION

1. Field of the Invention

The present invention relates to investment casting using stereolithography, and, more particularly, to a resin composition for eliminating breakage of a ceramic mold coating the resin composition during processing.

2. Description of Related Art

Investment casting is an industrial process which employs a disposable pattern (specimen or model) that is used to produce a mold in which parts can be cast. The pattern is made by injecting wax or plastic into a pattern die which has been manufactured by machining processes.

The pattern produced in the pattern die, which corresponds to the three-dimensional specimen used herein, is melted or burned out of the mold in which parts are later cast. Since the pattern possesses the shape of the required finished part, the parts which are later cast have the required shape.

The mold is built up around the pattern by a well-known process, typically coating the pattern with several coats of a ceramic slurry, with a drying step between each coating step. The pattern which is invested in the ceramic is then placed into a furnace or autoclave, causing the wax or plastic pattern to be melted or burned out of the resulting mold.

Removal of the pattern leaves a cavity in the mold, corresponding in shape and dimension to the final part. Molten material is then introduced into the mold and solidified by cooling. After solidification, the ceramic mold is broken away to release the finished part.

In an attempt to provide a pattern material that would not break the mold due to thermal expansion during burnout, a pattern produced by stereolithography was disclosed in U.S. Pat. No. 4,844,144, issued Jul. 4, 1989. The stereolithography composition comprises an ethylenically unsaturated liquid material in admixture with an easily heat-softenable thermoplastic material, such as an oligomer of low molecular weight which is inert with respect to the unsaturated material, which weakens the pattern when heated within the mold. The modified liquid composition cures in the presence of light to form a cross-linked polymeric matrix having interstices which are filled with the thermoplastic oligomer, and this oligomer functions to prevent the mold cracking by weakening the pattern before final burnout of the resin.

However, use of the inert diluent disclosed causes pattern weight losses of only 4 to 6% at 200° C. and 13 to 21% at 300° C. No weight loss at 100° C. was observed, and no indication of the temperature at which shrinking and cracking occurs is given.

Thus, a need remains to provide a resin composition for investment casting that does not cause breakage of the mold during burnout of the pattern and that leaves no residue in the mold after burnout.

SUMMARY OF THE INVENTION

In accordance with the invention, a resin composition is provided which contains a moderate boiling temperature liquid inert diluent. The presence of the liquid inert diluent allows the resin to be used as a pattern in investment casting by preventing breaking of the mold during burnout of the resin.

Any of the conventional resins suitable for stereolithography may be employed in the practice of the invention. Resins such as a light-curable, ethylenically unsaturated liquid, are combined with a suitable photoinitiator, and the moderate boiling point solvent is added in the amount of about 5 to 30 wt %. By "moderate" boiling point range is meant a temperature range of about 200° to 300° C.

A method of investment casting in accordance with the invention comprises the steps of:

(a) investing a three-dimensional pattern in a mold material, the pattern being constituted by a crosslinked polymeric matrix formed from a photochemical reaction of the foregoing resin and photoinitiator and containing the above-mentioned inert, moderate boiling point solvent; and (b) heating the material with the pattern in it to fuse the material of the mold and to burn the pattern out of the mold, the solvent weakening the pattern during the heating operation to prevent the thermal expansion of the pattern from cracking the mold.

Use of the moderate boiling point solvent in conjunction with the resin allows the pattern to shrink and crack at moderate temperature before final burnout. The shrinkage occurs faster and at a lower temperature as compared to the prior art. Bakeout losses of over 12% by weight at 100° C. are obtained with the process of the invention, causing shrinking and cracking of the pattern at that temperature.

DESCRIPTION OF THE PREFERRED EMBODIMENTS

The present invention describes a resin composition containing a moderate boiling temperature (about 200° to 300° C.) liquid inert diluent which allows the resin to be used in investment casting.

In investment casting, a removable model, or pattern, is used to create a mold into which metal is cast, similar to the "lost wax process" in which the removable pattern there is typically made of wax block. In the process of the present invention, the pattern is formed stereolithographically via a well-known process (described by C. W. Hull in U.S. Pat No. 4,575,330), and employs the modified resin of the present invention. After a ceramic mold has been created around the plastic pattern, the pattern is first shrunk and cracked (via removal of the moderate boiling point liquid). Any residual plastic is removed by burnout, which comprises heating at a high temperature. No cracking of the ceramic mold occurs during pattern burnout due to thermal expansion of the pattern, which has already shrunk. In contrast, use of a resin composition which cannot be shrunk breaks the ceramic mold, due to resin expansion, during burnout.

The method of investment casting includes the steps of forming a thin layer of a light-curable resin; exposing the thin layer to a light source to cause polymerization of selected portions of the layer; covering the polymerized layer with another layer of the light-curable resin; exposing the uncured layer to the light source to polymerize selected portions of the uncured layer upon the previously polymerized layer; repeating the layer formation and exposure steps as often as desired to produce a specimen; completing the cure of the specimen to produce a pattern; and investing the pattern in a mold material as above.

Stereolithography is a process to form three-dimensional patterns or models using a computer guided light to solidify layers of a light curable resin material. Investment casting is a process which encases the pattern with a ceramic mold by successive coating of the pattern within an aqueous ceramic slurry followed by drying. The pattern is removed from the mold by heating at high temperature to "burn out" the resin. Use of currently-available resins is not successful. Currently-used resins expand during the burnout and often crack the ceramic mold. In the present invention, a moderate boiling liquid inert diluent is added to the resin composition, which allows the pattern to shrink and crack at moderate temperature before final burnout. The shrinkage occurs faster and at lower temperature as compared to the prior art. Specifically, significant shrinkage is seen even as low as 100° C.

Use of the modified resin of the invention permits use of investment casting of stereolithographically-made patterns. The output from a computer aided design (CAD) program can be directly input to the computer which controls the stereolithography device. Very complex shapes can be created rapidly on the stereolithography device. The term "rapid prototyping" has been given to this process. A major use of the stereolithographically-made patterns is to utilize them in the investment casting process to quickly make prototype metal models. As such, the present invention allows fast and inexpensive metal parts production.

The modified resin composition of the present invention employs any of the resins and any of the photoinitiators suitable for stereolithography. Such resins are well-known and typically comprise a light-curable, ethylenically unsaturated liquid resin, including, but not limited to, vinyls, acrylates, methacrylates, and vinyl ethers. Preferred are acrylate functional oligomers, including epoxy acrylates such as acrylate resins of bisphenol A epoxy resin, ethoxylated bisphenol A dimethacrylate, and various urethane (meth)acrylate compositions. A specific example of a suitable resin includes Ciba-Geigy XB5131 acrylate ester blend, which contains the acrylate ester of bisphenol A epoxy resin, ethoxylated bisphenol A dimethacrylate, trimethylol propane triacrylate, 2-phenoxy ethyl acrylate, a photoinitiator (1-hydroxycyclohexyl phenyl ketone), and 1-vinyl-2-pyrrolidinone. A second specific example of a suitable resin includes Ciba-Geigy XB5154 acrylate ester blend, which contains aliphatic urethane acrylate resin, dimethacrylate ester, and diacrylate ester. Yet another specific example includes DuPont SOMOS TM Photopolymer 3100 photopolymer, which contains triacrylate monomer, diacrylate monomer, acrylate oligomer, and photoinitiator. Other photopolymerizable resins are also commercially available and thus suitably employed in the practice of the present invention. These contain mixtures of (meth)acrylate compositions together with a photoinitiator suitable for the wavelength of the stereolithography laser, which typically operates in the ultraviolet (UV) to visible light range of about 200 to 600 nanometers (nm).

Examples of photoactivated free radical photoinitiators employed include, but are not limited to, benzyl and phenyl ketones, benzyl and phenyl ketals benzoin ethers acetophenones, benzoyl oximes, acylphosphines, xanthones, and quinones, and the like, for example, benzophenone, $\alpha\alpha$-dimethoxyphenylacetophenone, 1-hydroxycyclohexyl phenyl ketone, benzyldimethyl ketal, isopropylthioxanthone, and ethyl 4-(dimethylamino benzoate). Cationic photoinitiators used with vinyl ether resins include, but are not limited to, di- and tri-aryliodonium, sulfonium, and arsenic and selenium salts, such as triarylsulfonium hexafluoroantimonate, triarylsulfonium hexafluorophosphate, and 4,4'-di-t-butyldiphenyliodinium hexafluoroarsenate.

Additional light-curable, ethylenically unsaturated liquid resins and photoinitiators suitably employed in the practice of the invention are listed in U.S. Pat. No. 4,844,144, which is expressly incorporated by reference.

In the practice of the present invention, a modified resin composition is formulated which adds to the above photopolymerizable mixture a moderate boiling point inert solvent in a concentration of between 5 and 30%. All amounts herein are in terms of weight percent, unless otherwise specified. Such a solvent is soluble in the resin composition, is inert to vinyls and radicals generated during the photochemical reaction, and has a boiling point ranging from about 200° to 300° C. A preferred solvent is propylene carbonate, which has a boiling point of 240° C. Examples of other inert solvents suitably employed in the practice of the present invention include phenol, glycerol, ethylene glycol, diglyme, benzylethyl ether, phenylether, veratrole, ethylene glycol diacetate, benzyl acetate, benzyl alcohol, methylbenzoate, ethylbenzoate, butyrolactone, ethyl malonate, butyl phosphate, trichlorotrifluoroethane, chloronaphthalene, nitrobenzene, succinonitrile, tolunitrile, octanitrile, benzonitrile, aniline, toluidine, quiniline, and the like.

The modified formulation of the present invention also includes additional photoinitiator, beyond that provided in the commercially-available composition. Such photoinitiator may comprise any of the photoinitiators commonly employed with the light-curable, ethylenically unsaturated liquid resins. The additional photoinitiator is used to compensate for the added solvent. The total amount of photoinitiator in the composition ranges from about 2 to 10%, including that amount already present in a commercial photopolymerizable resin formulation.

A trifunctional, tetrafunctional or higher functional crosslinker, for example, acrylate or methacrylate, such as pentaerythritol tetraacrylate, may be added to insure a fast build time in the stereolithography device and sufficient green strength (strength of the part after removal from the stereolithography machine but before final ultraviolet (UV) cure). The amount of the crosslinker, if employed, ranges from about 2 to 20%. Other common multifunctional crosslinkers, such as vinyl ethers, may also be employed in the practice of the invention. Examples of multifunctional crosslinkers include, but are not limited to, tris(2-hydroxy ethyl) isocyanurate trimethylacrylate, trimethylolpropane tri(meth)acrylate, tris(2-hydroxy ethyl isocyanurate triacrylate, and dipentaerythritol pentaacrylate.

After combining the components and casting into the desired shape, the mold is burned out. The general preferred burnout procedure comprises (a) slowly heating the ceramic/plastic casting to about 80° to 120° C. at a rate of about 2° to 10° C. per hour, (b) holding at that temperature for about 4 to 12 hours for breakage and shrinkage of the plastic casting, or pattern, to occur, (c) heating to 140° to 160° C. at a rate of about 1° to 5° C. per minute and holding at that temperature for about 2 to 8 hours to complete shrinkage of the pattern, and (d) heating to an elevated temperature in the range of about 750° to 1,000° C. at a rate of about 1° to 5° C. per minute and holding at that temperature for about 2 to 8 hours to complete plastic removal.

EXAMPLES

EXAMPLE 1

In one preferred embodiment of the present invention, a mixture of CIBA XB5131 resin (100 parts), propylene carbonate (15 parts), pentaerythritol tetraacrylate (10 parts), and IRGACURE 651 photoinitiator (5 parts) was used to make a stereolithographic pattern in the usual manner, using a 3D Systems SLA 500 argon ion rapid prototyping apparatus for stereolithography. The pattern was invested in a ceramic slurry and dried, then subjected to the following burnout cycle:
1. Ambient to 100° C. over 20 hours.
2. 100° C. for 8 hours.
3. 100° C. to 150° C. over one hour.
4. 150° C. for 4 hours.
5. Final Burnout 750° C. to 1,000° C.

A metal model was made from this mold without difficulty. The metal casting had a good surface finish, retained a desired dimensional shape, and had no residual resin in the mold after burnout. Also, there was no cracking or fracture of the mold.

EXAMPLE 2

In another run, 700 parts Ciba-Geigy XB5131 resin, 140 parts propylene carbonate inert solvent, 150 parts pentaerythritol tetraacrylate crosslinker, and 7.5 parts added photoinitiator Ciba-Geigy 651 were combined and processed as in Example 1. This has been determined to be the optimum formulation for resolution, part building speed, and green strength of multi-layer parts built with a 3D Systems SLA-500 (argon ion laser).

EXAMPLE 3

In a trial run that has not been optimized for speed, resolution, and green strength, the inert diluent propylene carbonate (15%) was formulated into DuPont SOMOS ™ Photopolymer 3100 stereolithography resin composition. After part fabrication to form a pattern and conventional burnout as in Example 1, the pattern exhibited the characteristic cracking and shrinking.

EXAMPLE 4

In another trial run, the inert diluent propylene carbonate (15%) was formulated into Ciba-Geigy LMB 5241 stereolithography resin composition. After part fabrication to form a pattern and conventional burnout as in Example 1, the pattern exhibited the characteristic cracking and shrinking.

Thus, there has been disclosed a resin composition and process for investment casting using stereolithography. It will be appreciated by those skilled in the art that various modifications and changes of an obvious nature may be made without departing from the scope of the invention, and all such modifications and changes are intended to fall within the scope of the invention, as defined by the appended claims.

What is claimed is:

1. A stereolithographic resin for investment casting comprising;
   (a) at least one light-curable, ethylenically unsaturated liquid resin;
   (b) at least one photoinitiator, ranging in concentration from about 2 to 10%, and
   (c) at least one solvent having a boiling point of about 200° to 300° C., inert to said light-curable, ethylenically unsaturated liquid resin and soluble in said resin, wherein said solvent is present in the amount of about 5 to 30 weight percent.

2. The stereolithographic resin of claim 1 wherein said moderate boiling point solvent is selected from the group consisting of propylene carbonate, phenol, glycerol, ethylene glycol, diglyme, benzylethyl ether, phenylether, veratrole, ethylene glycol diacetate, benzyl acetate, benzyl alcohol, methylbenzoate, ethylbenzoate, butyrolactone, ethyl malonate, butyl phosphate, trichlorotrifluoroethane, chloronaphthalene, nitrobenzene, succinonitrile, tolunitrile, octanitrile, benzonitrile, aniline, toluidine, and quinoline.

3. The stereolithographic resin of claim 1 wherein said light-curable, ethylenically unsaturated liquid resin is selected from the group consisting of vinyls, acrylates, methacrylates, and vinyl ethers.

4. The stereolithographic resin of claim 1 wherein said photoinitiator comprises a photoactivated free radical initiator selected from the group consisting of benzyl and phenyl ketones, benzyl and phenyl ketals, benzoin ethers, acetophenones, benzoyl oximes, acylphosphines, xanthones, and quinones.

5. The stereolithographic resin of claim 1 further including a multifunctional crosslinker.

6. The stereolithographic resin of claim 5 wherein said multifunctional crosslinker is present in an amount ranging from about 2 to 20%.

7. A stereolithographic resin for investment casting comprising:
   (a) at least one light-curable, ethylenically unsaturated liquid selected from the group consisting of vinyls, acrylates, and methacrylates;
   (b) at least one photoinitiator, ranging in concentration from about 2 to 10%;
   (c) at least one solvent inert to said light-curable, ethylenically unsaturated liquid, soluble therein, and having a boiling point ranging from about 200° to 300° C.; and
   (d) at least one multifunctional crosslinker, ranging in concentration from about 2 to 20%.

8. The stereolithographic resin of claim 7 wherein said solvent is selected from the group consisting of propylene carbonate,-phenol, glycerol, ethylene glycol, diglyme, benzylethyl ether, phenylether, veratrole, ethylene glycol diacetate, benzyl acetate, benzyl alcohol, methylbenzoate, ethylbenzoate, butyrolactone, ethyl malonate, butyl phosphate, trichlorotrifluoroethane, chloronaphthalene, nitrobenzene, succinonitrile, tolunitrile, octanitrile, benzonitrile, aniline, toluidine, and quinoline.

9. The stereolithographic resin of claim 8 wherein said inert solvent comprises propylene carbonate.

10. A method of investment casting comprising the steps of:
    (a) investing a three-dimensional pattern in a mold material, said pattern being constituted by a crosslinked polymeric matrix constituted by a light-cured ethylenically unsaturated material having dissolved therein a solvent having a boiling point ranging from about 200° to 300° C., being non-reactive with said ethylenically unsaturated material, and being soluble therein; and
    (b) heating said mold material with said pattern to burn said pattern out of said mold, said solvent shrinking and cracking said pattern during the heating operation to prevent the thermal expansion of said pattern from cracking said mold.

11. The method of claim 10 wherein said moderate boiling point solvent is selected from the group consisting of propylene carbonate, phenol, glycerol, ethylene glycol, diglyme, benzylethyl ether, phenylether, veratrole, ethylene glycol diacetate, benzyl acetate, benzyl alcohol, methylbenzoate, ethylbenzoate, butyrolactone, ethyl malonate, butyl phosphate, trichlorotrifluoroethane, chloronaphthalene, nitrobenzene, succinonitrile, tolunitrile, octanitrile, benzonitrile, aniline, toluidine, and quinoline.

12. The method of claim 10 wherein said light-curable, ethylenically unsaturated liquid is selected from the group consisting of vinyls, acrylates, methacrylates, and vinyl ethers.

13. The method of claim 10 wherein said photoinitiator comprises a photoactivated free radical initiator selected from the group consisting of benzyl and phenyl ketones, benzyl and phenyl ketals, benzoin ethers, acetophenones, benzoyl oximes, acylphosphines, xanthones, and quinones.

14. The method of claim 10 wherein said burnout is performed under the following conditions:
   (a) slowly heating said mold material with said pattern therein to a temperature within the range of about 80° to 120° C. at a rate of about 2° to 10° C. per hour;
   (b) holding at that temperature for 4 to 12 hours for breakage and shrinkage of said pattern to occur;
   (c) heating to a temperature within the range of about 140° to 160° C. at a rate of about 1° to 5° C. per minute and holding at that temperature for about 2 to 8 hours to complete shrinkage of said pattern; and
   (d) heating to an elevated temperature in the range of about 750° to 1,000° C. at a rate of about 1° to 5° C. per minute and holding at that temperature for about 2 to 8 hours to complete removal of said pattern.

15. A method of investment casting comprising the steps of:
   (a) forming a first thin layer of a light-curable liquid formulation comprising
      (1) at least one light-curable, ethylenically unsaturated liquid resin selected from the group consisting of vinyls, acrylates, and methacrylates,
      (2) at least one photoinitiator, ranging in concentration from about 2 to 10%,
      (3) about 5 to 30 wt % of at least one inert solvent having a boiling point ranging from about 200° to 300° C. and being essentially non-reactive with said light-curable, ethylenically unsaturated liquid and soluble therein, and
      (4) a multifunctional crosslinker, ranging in concentration from about 2 to 20%;
   (b) exposing said first thin layer of said light-curable liquid formulation to a light source to cause polymerization of selected portions of said layer and form a first polymerized layer;
   (c) covering said first polymerized layer with a second thin layer of said light-curable liquid formulation;
   (d) exposing said second thin layer to said light source to polymerize selected portions of said layer upon said first polymerized layer and form a second polymerized layer;
   (e) repeating steps (b) and (c) at least once to produce a specimen;
   (f) completing the cure of said specimen to produce a pattern;
   (g) investing said pattern in a mold material; and
   (h) heating said mold material with said pattern in it to fuse the material of said mold and to burn said pattern out of said mold to produce a mold.

16. The method of claim 15 wherein said inert solvent comprises propylene carbonate.

17. The method of claim 15 wherein said light-curable liquid formulation is exposed to a light source having a wavelength in the range of about 200 to 600 nm.

18. The method of claim 15 wherein said burnout is performed under the following conditions:
   (a) slowly heating said mold material with said pattern therein to a temperature within the range of about 80° to 120° C. at a rate of about 2° to 10° C. per hour;
   (b) holding at that temperature for 4 to 12 hours for breakage and shrinkage of said pattern to occur;
   (c) heating to a temperature within the range of about 140° to 160° C. at a rate of about 1° to 5° C. per minute and holding at that temperature for about 2 to 8 hours to complete shrinkage of said pattern; and
   (d) heating to an elevated temperature in the range of about 750° to 1,000° C. at a rate of about 1° to 5° C. per minute and holding at that temperature for about 2 to 8 hours to complete removal of said pattern.

* * * * *